(12) United States Patent
Tsai et al.

(10) Patent No.: US 10,290,547 B2
(45) Date of Patent: May 14, 2019

(54) METHOD OF MANUFACTURING A SEMICONDUCTOR DEVICE WITH METAL GATE ETCH SELECTIVITY CONTROL

(71) Applicant: TAIWAN SEMICONDUCTOR MANUFACTURING CO., LTD., Hsinchu (TW)

(72) Inventors: Chia-Ching Tsai, Tainan (TW); Yi-Wei Chiu, Hsinchu (TW); Li-Te Hsu, Tainan County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/823,134

(22) Filed: Nov. 27, 2017

(65) Prior Publication Data

US 2018/0174915 A1 Jun. 21, 2018

Related U.S. Application Data

(60) Provisional application No. 62/434,926, filed on Dec. 15, 2016.

(51) Int. Cl.
| | |
|---|---|
| *H01L 21/8234* | (2006.01) |
| *H01L 29/66* | (2006.01) |
| *H01L 29/49* | (2006.01) |
| *H01L 21/3213* | (2006.01) |
| *H01L 21/321* | (2006.01) |
| *H01L 21/311* | (2006.01) |
| *H01L 29/78* | (2006.01) |
| *H01L 27/088* | (2006.01) |

(52) U.S. Cl.
CPC ........ *H01L 21/823456* (2013.01); *H01L 21/31116* (2013.01); *H01L 21/32115* (2013.01); *H01L 21/32136* (2013.01); *H01L 21/82345* (2013.01); *H01L 21/823431* (2013.01); *H01L 27/088* (2013.01); *H01L 29/495* (2013.01); *H01L 29/4966* (2013.01); *H01L 29/66545* (2013.01); *H01L 29/785* (2013.01)

(58) Field of Classification Search
CPC ....... H01L 21/823456; H01L 21/31116; H01L 29/495; H01L 21/32115; H01L 29/4966; H01L 29/66545; H01L 21/823431; H01L 21/32136
USPC ....................................................... 438/275
See application file for complete search history.

(56) References Cited

U.S. PATENT DOCUMENTS

| | | | | |
|---|---|---|---|---|
| 2014/0008720 A1* | 1/2014 | Xie | ............. | H01L 27/092 257/331 |
| 2015/0262812 A1* | 9/2015 | Liu | ............. | H01L 21/0274 438/587 |
| 2017/0236759 A1* | 8/2017 | Jagannathan | ......... | H01L 21/845 257/392 |

* cited by examiner

*Primary Examiner* — Vu A Vu
(74) *Attorney, Agent, or Firm* — McDermott Will & Emery LLP (57) ABSTRACT

A method of manufacturing a semiconductor device includes forming a first layer of a conductive material in gate spaces created by removing portions of a dummy gate structure. The first layer further includes a top layer on an entire structure formed on a fin structure, and a gate space for a short channel gate and a gate space for a long channel gate. A first portion of the top layer is removed to leave a hard mask layer over a long channel gate region. The hard mask layer and a portion of heights of the conductive material in the gate spaces are removed to form a first structure. A second layer of the conductive material is formed over the first structure. Portions of the second layer are removed to create a recessed conductive portion for the short channel gate and a recessed conductive portion for the long channel gate.

20 Claims, 8 Drawing Sheets

METHOD OF MANUFACTURING A SEMICONDUCTOR DEVICE WITH METAL GATE ETCH SELECTIVITY CONTROL

CROSS-REFERENCE TO RELATED APPLICATIONS

This application claims priority to U.S. Provisional Patent Application No. 62/434,926 filed Dec. 15, 2016, the entire disclosure of which is incorporated herein by reference.

TECHNICAL FIELD

The disclosure relates to semiconductor integrated circuit manufacturing, and more particularly, to a method of metal gate etch selectivity control for multi patterning gate (MPG) process loop.

BACKGROUND

As the semiconductor industry has progressed into nanometer technology process nodes in pursuit of higher device density, higher performance, and lower costs, challenges from both fabrication and design issues have resulted in the development of three-dimensional designs, such as fin field-effect transistors (Fin FETs). In a Fin FET, the transistor channel rises above the planar substrate to form a fin structure, with a gate electrode adjacent to two side surfaces and the top surface of a channel region with a gate dielectric layer interposed between them.

Multi patterning may be used to pattern Fin FET gate electrodes (e.g., metals) in a process known as multi patterning gate (MPG) loop. The MPG loop is an important process for an advanced technology node, for example, N10 process flow. The MPG loop can damage the gate metal by undesirably reducing the gate height, which can adversely affect the device performance. Solutions are required that can effectively reduce the gate height reduction damage resulting from the MPG loop.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed, interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The device may be otherwise oriented (rotated 90 degrees or at other orientations), and the spatially relative descriptors used herein may likewise be interpreted accordingly. In addition, the term "made of" may mean either "comprising" or "consisting of."

Figure 1:
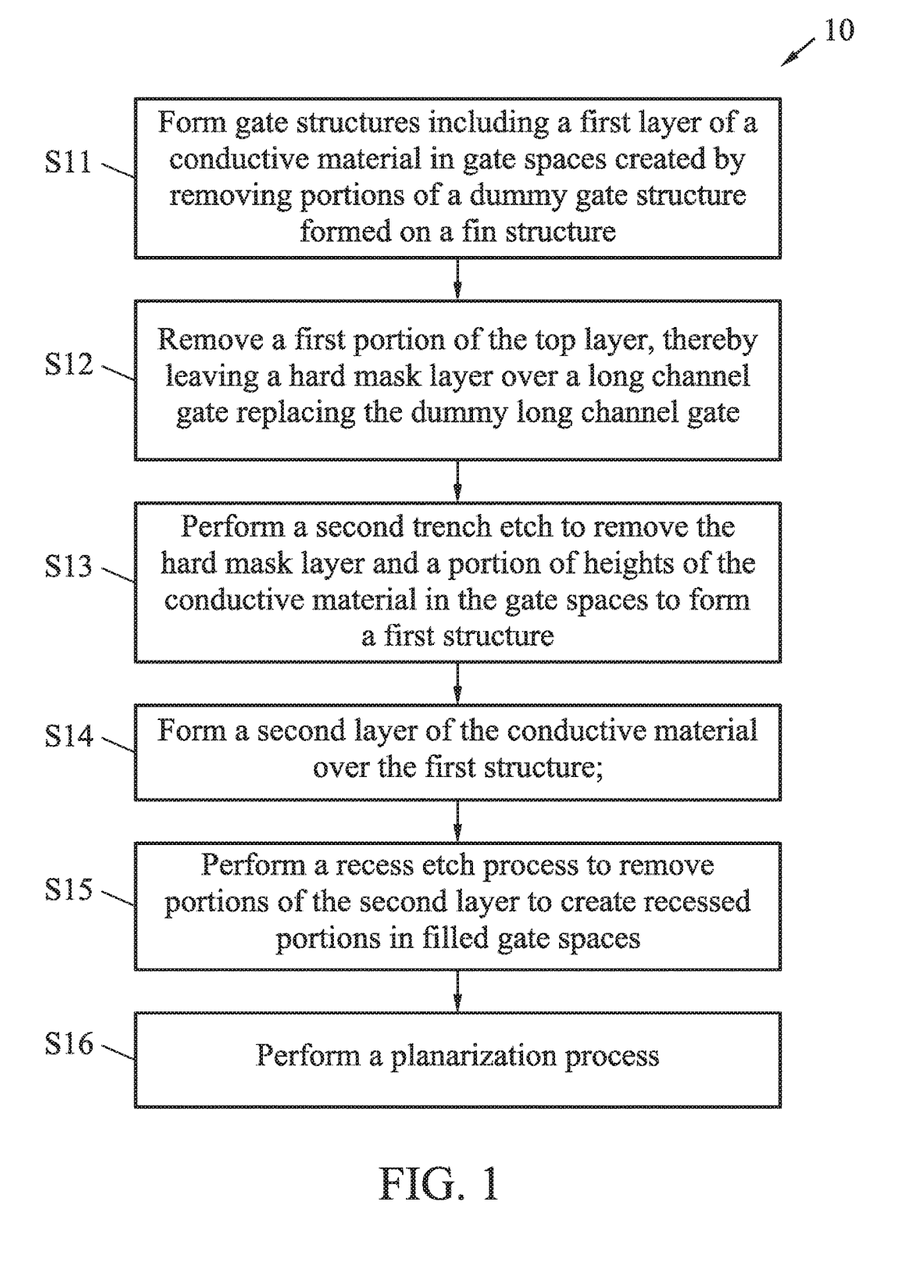
FIG. 1 is a process flow chart depicting a method of manufacturing a semiconductor device with metal gate etch selectivity control according to one or more embodiments of the present disclosure.

FIG. 1 is a process flow chart depicting a method of manufacturing a semiconductor device with metal gate etch selectivity control according to one or more embodiments of the present disclosure. The flow chart 10 illustrates only a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable.

In S11 of FIG. 1, gate structures including a first layer of a conductive material are formed in gate spaces created by removing portions of a dummy gate structure formed on a fin structure, as shown in X-cut views 20-60 of FIGS. 2-6. In some embodiments, the dummy gate structure includes a number of dummy short channel gates (e.g., 22 and 24) and a dummy long channel gate 26, as shown in the X-cut view 20 of FIG. 2. For a short channel gate the gate length can be less than 30 nm, in some embodiments. For a long channel gate the gate length can be larger than for the short channel gate, for example, larger than 30 nm. The dummy gate structure is created on a fin structure 18. The fin structure 18 further includes source and drain regions 29, which are formed over recessed portion of the fin structure by using an epitaxial growth method, in some embodiments.

In some embodiments, the fin structure 18 is formed on or is part of a substrate. The substrate can be a p-type silicon substrate with an impurity concentration in a range of about $1 \times 10^{15}$ cm$^{-3}$ to about $3 \times 10^{15}$ cm$^{-3}$ in some embodiments. In other embodiments, the substrate can be an n-type silicon substrate with an impurity concentration in a range of about $1 \times 10^{15}$ cm$^{-3}$ to about $3 \times 10^{15}$ cm$^{-3}$. The crystal orientation of silicon substrate is (100) in some embodiments.

Alternatively, the substrate may comprise another elementary semiconductor, such as germanium, a compound semiconductor including Group IV-IV compound semiconductors such as silicon carbide (SiC) and silicon germanium (SiGe), and Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one or more embodiments, the substrate is a silicon layer of an SOI (silicon-on-insulator) substrate. Amorphous substrates, such as amorphous silicon or amorphous silicon carbide (SiC), or insulating material, such as silicon oxide, may also be used as the substrate. The substrate may include various regions that have been suitably doped with impurities (e.g., p-type or n-type conductivity).

Figure 2:
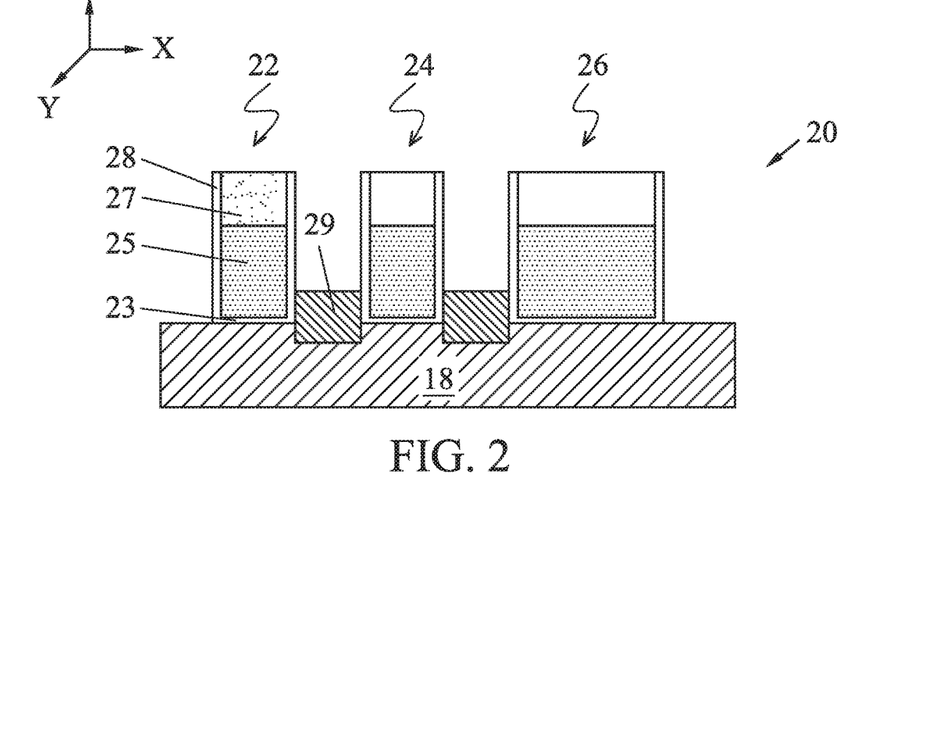
FIG. 2 depicts one stage in a method of manufacturing a semiconductor device with metal gate etch selectivity control according to one or more embodiments of the present disclosure.

In some embodiments, the dummy short channel gates (e.g., 22 and 24) and a dummy long channel gate 26 includes a dummy gate electrode layer 25 made of poly silicon and a dummy gate dielectric layer 23. Sidewall spacers 28 including one or more layers of insulating materials are also formed on sidewalls of the dummy gate electrode layer 25. The sidewall spacers 28 include one or more layers of insulating material such as silicon nitride based material including SiN, SiON, SiCN and SiOCN, or any other suitable dielectric material. The film thickness of the sidewall spacers 28 at the bottom of the sidewall spacers is within a range from about 3 nm to about 15 nm in some embodiments, and is within a range from about 4 nm to about 8 nm in other embodiments.

The dummy gate structures further include a mask insulating layer 27, which is used to pattern a poly silicon layer into the dummy gate electrode layers. The thickness of the mask insulating layer 27 is in a range from about 10 nm to about 30 nm in some embodiments, and is in a range from about 15 nm to about 20 nm in other embodiments.

Figure 3:
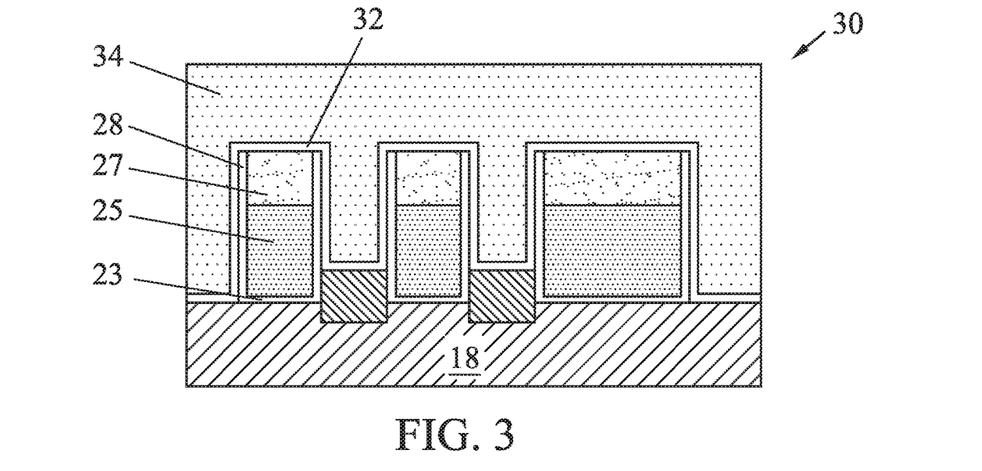
FIG. 3 depicts one stage in a method of manufacturing a semiconductor device with metal gate etch selectivity control according to one or more embodiments of the present disclosure.

According to some embodiments, after formation of the dummy gate structure including dummy short channel gates (e.g., 22 and 24) and a dummy long channel gate 26 and the source and drain regions 29, an etching stop layer (ESL) 32 and an interlayer insulating (ILD) layer 34, as shown in the X-cut view 30 of FIG. 3, are formed over the dummy gate structures and the source/drain regions. The ESL 32 includes one or more layers of insulating material such as silicon nitride based material including SiN, SiCN and SiOCN, or any other suitable dielectric material. The thickness of the ESL 32 is within a range from about 3 nm to about 10 nm in some embodiments. The ILD layer 34 includes one or more layers of insulating material such as silicon oxide based material such as silicon dioxide ($SiO_2$) and SiON, or any other suitable dielectric material.

Figure 4:
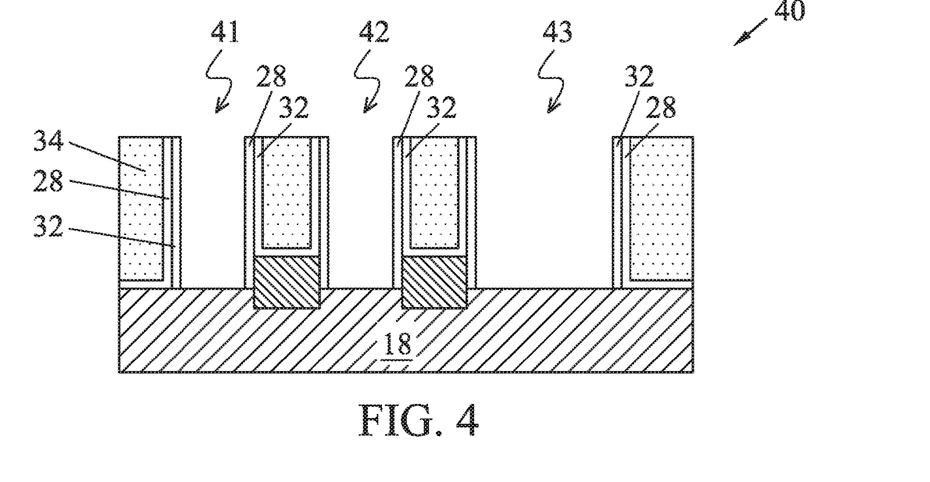
FIG. 4 depicts one stage in a method of manufacturing a semiconductor device with metal gate etch selectivity control according to one or more embodiments of the present disclosure.

In some embodiments, after formation of the ESL 32 and the ILD layer 34, a planarization operation is performed on the first ILD layer 34 and the ESL 32, and the dummy gate structures are removed so as to make gate spaces 41, 42 and 43, as shown in the X-cut view 40 of FIG. 4. As shown in FIG. 4, the gate sidewall spacers 28 remain in the gate spaces 41, 42 and 43.

Figure 5:
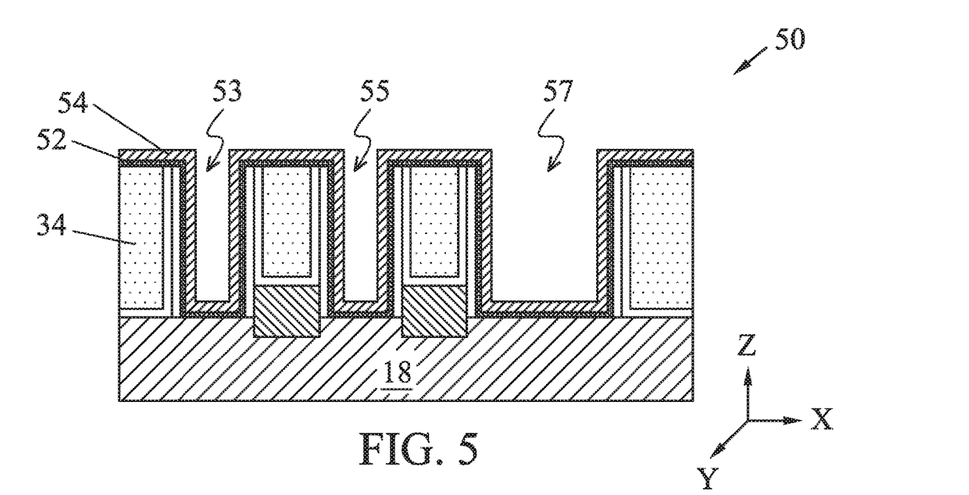
FIG. 5 depicts one stage in a method of manufacturing a semiconductor device with metal gate etch selectivity control according to one or more embodiments of the present disclosure.

Next, as shown in the X-cut view 50 FIG. 5, a gate dielectric layer 52 is formed. The gate dielectric layer 52 includes one or more layers of dielectric material, such as a high-k metal oxide. Examples of the metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, an interfacial layer (not shown) made of, for example, silicon oxide is formed over the fin structure (channel region) before forming the gate dielectric layer 52. A blanket layer of a suitable dielectric material is formed over the gate spaces and the first ILD layer 34, by using CVD, PVD, ALD or other suitable film forming methods.

Further, a work function adjustment (WFA) layer 54 for a p-channel FET is formed in the gate spaces 41, 42 and 43. A blanket layer of a suitable conductive material is formed over the gate spaces and the first ILD layer 34. The WFA layer 54 includes one or more layers of conductive material. Examples of the WFA layer 54 for a p-channel FET include Ti, TiAlC, Al, TiAl, TaN, TaAlC, TiN, TiC and Co, or any other suitable conductive material. In one embodiment, TiN is used for a p-channel FET. Examples of the WFA layer 54 for an n-channel FET include TiN, TaN, TaAlC, TiC, TiAl, TaC, Co, Al, TiAl, HfTi, TiSi, TaSi or TiAlC, or any other suitable conductive material. In one embodiment, TaAlC, TiAl or Al is used for an n-channel FET. The thickness of the WFA layer 54 is within a range from about 3 nm to about 10 nm in some embodiments. The WFA layer 54 may be formed by chemical vapor deposition (CVD), physical vapor deposition (PVD) including sputtering, atomic layer deposition (ALD) or other suitable method. As shown in FIG. 5, the WFA layer 54 is conformally formed in the gate spaces 41, 42 and 43. In some embodiments, the n-channel FET may be formed using the gate space 55 and the p-channel FET may be formed using the gate space 53. The n-channel FET may include one or more additional or different WFA layers (not shown for simplicity).

In some embodiments, the WFA layer for the n-channel FETs is formed prior to forming the WFA layer 54 in the gate space 53 for the p-channel FET. The WFA layer includes one or more layer of conductive material. Examples of the WFA layer for an n-channel FET include TiN, TaN, TaAlC, TiC, TaC, Co, Al, TiAl, HfTi, TiSi, TaSi or TiAlC. In one embodiment, TiN is used. The thickness of the WFA layer for the n-channel FET is in a range from about 3 nm to about 10 nm in some embodiments, and may be different from the thickness of the WFA layer for the p-channel FET. The WFA layer may be formed by chemical vapor deposition (CVD), physical vapor deposition (PVD) including sputtering, atomic layer deposition (ALD) or other suitable methods. The WFA layer is patterned and etched to cover only the n-channel FET (e.g., the gate space 55) in some embodiments. In some embodiments, the WFA layer for the n-channel FET is made of a different material than the WFA layer 54 for the p-channel FET.

Figure 6:
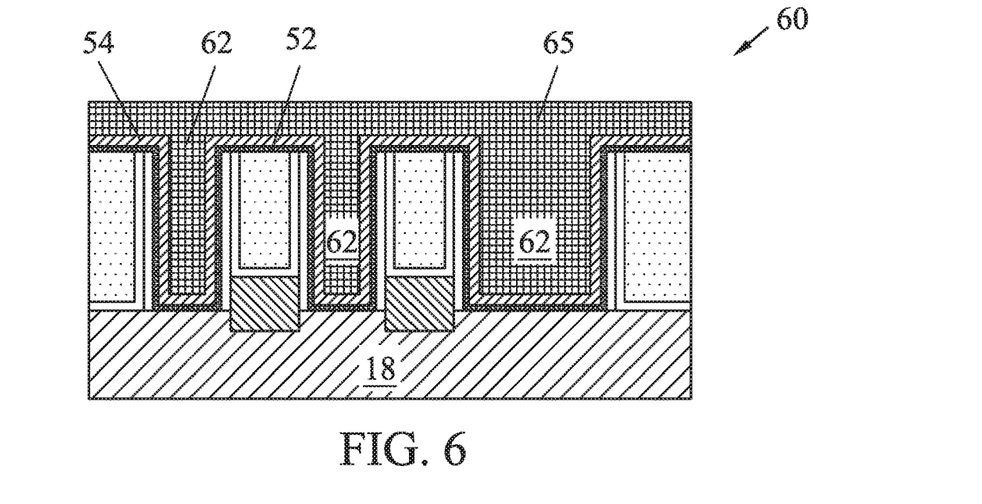
FIG. 6 depicts one stage in a method of manufacturing a semiconductor device with metal gate etch selectivity control according to one or more embodiments of the present disclosure.

In some embodiment, a first layer 62 of a conductive material is formed, as shown in the X-cut view 60 of FIG. 6, in gate spaces 53, 55 and 57 of FIG. 5, the first layer 62 fills the gate spaces 53, 55 and 57 and further creates a top layer 65 over an entire structure formed on the fin structure 18. In some embodiments, the first layer 62 is formed of a conductive material including one or more layers of a metal material, such as tungsten (W), cobalt (Co), ruthenium (Ru), or iridium (Ir), or other metals. In other embodiments, the conductive material includes a silicon alloy including one of titanium silicon alloy ($Ti_xSi_y$), cobalt silicon alloy ($Co_xSi_y$), Nickle silicon alloy ($Ni_xSi_y$), tungsten silicon alloy ($W_xSi_y$), molybdenum silicon alloy ($Mo_xSi_y$), tantalum silicon alloy ($Ta_xSi_y$), or other suitable conductive materials. In one embodiment, W is used. The conductive material is formed by CVD, PVD, ALD, electroplating or other suitable methods.

Figure 7:
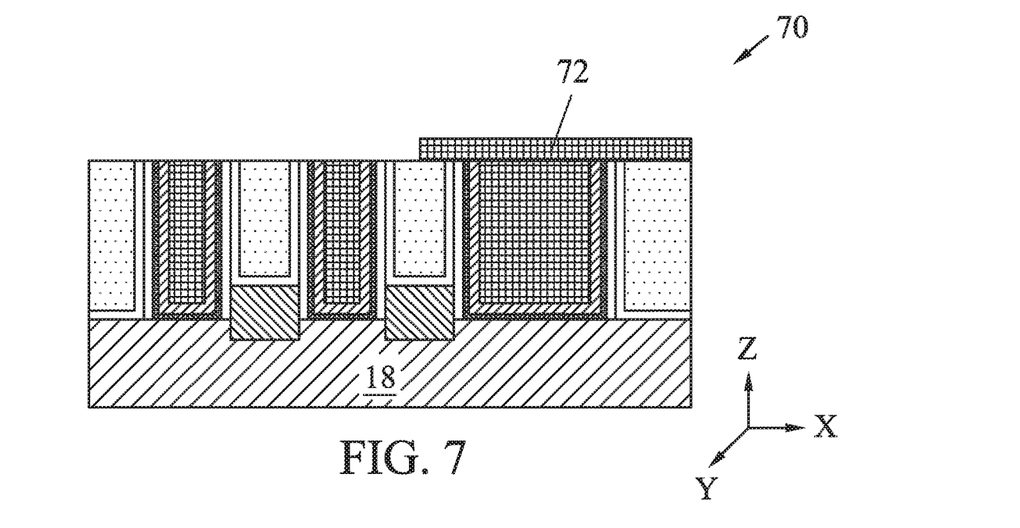
FIG. 7 depicts one stage in a method of manufacturing a semiconductor device with metal gate etch selectivity control according to one or more embodiments of the present disclosure.

In S12 of FIG. 1, a first portion of the top layer 65 is patterned and removed, thereby leaving a portion 72 that is to be used as a hard mask layer over the long channel gate, as shown in an X-cut view 70 of FIG. 7. The hard mask layer 72 extends in a first direction (e.g., X direction) on sides of the long channel gate. The removal of the first portion of the top layer 65 can be performed using a dry etch process, such as a plasma etch process, in some embodiments, although other etch processes may be used. In some embodiments, $CF_4$, $Cl_2$ and/or $BCl_3$ are used as an etching gas. By adjusting etching time, for example, the first portion of the top layer 65 above the short channel area is etched until the upper surface of the ILD layer 34.

Figure 8:
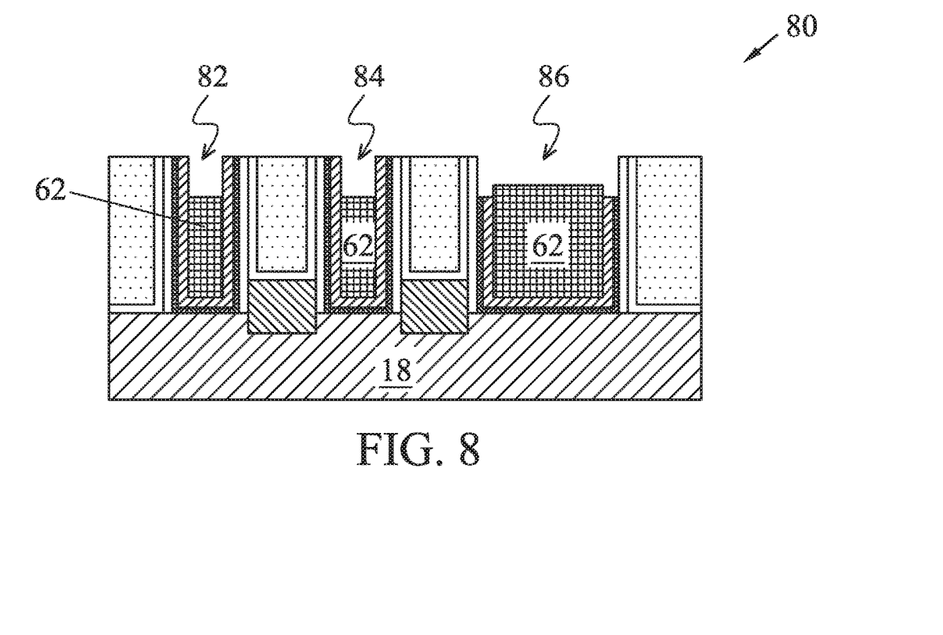
FIG. 8 depicts one stage in a method of manufacturing a semiconductor device with metal gate etch selectivity control according to one or more embodiments of the present disclosure.

In S13 of FIG. 1, a second trench etch process is performed to remove the hard mask layer and a portion of heights of the conductive material in the gate spaces to form a first structure 80, as shown in of FIG. 8. As shown in the first structure 80, the portions 82, 84, and 86 of the height of the conductive material (e.g., 62) in the gate spaces is removed by the second trench etch process. In some embodiments, the second trench etch process is a dry etch process, such as a plasma etch process, although other etch processes may be used. The second trench etch process can remove more of the height of the conductive material (e.g., 62) in narrower SC channels (e.g., 82 and 84) than the wider LC channel (e.g., 86). In some embodiments, $CF_4$, $Cl_2$ and/or $BCl_3$ are used as an etching gas.

Figure 9:
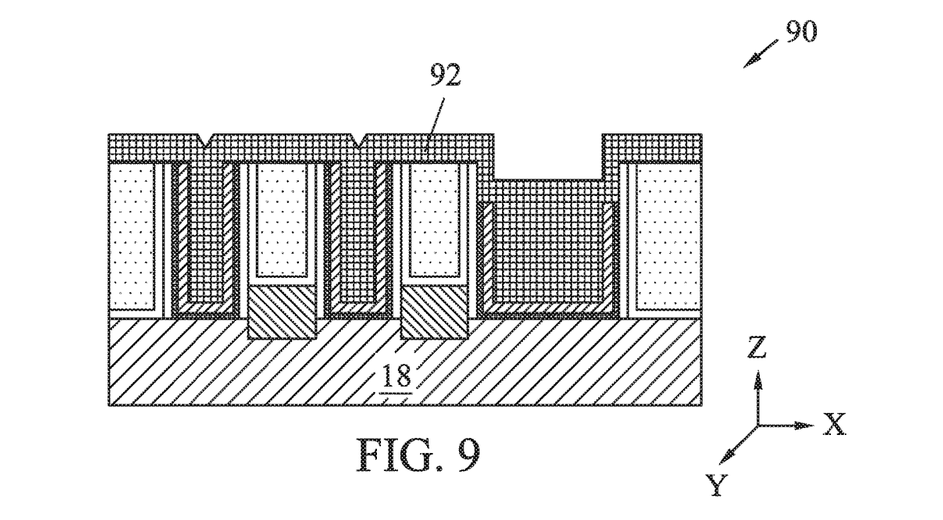
FIG. 9 depicts one stage in a method of manufacturing a semiconductor device with metal gate etch selectivity control according to one or more embodiments of the present disclosure.

In S14 of FIG. 1, a second layer 92 of the conductive material is formed over the first structure 80, as shown in an X-cut view 90 of FIG. 9. In some embodiments, the conductive material of the second layer 92 includes one or more layers of metal material, such as tungsten (W), cobalt (Co), ruthenium (Ru), or iridium (Ir), or other metals. In other embodiments, the conductive material includes a silicon alloy including one of titanium silicon alloy ($Ti_xSi_y$), cobalt silicon alloy ($Co_xSi_y$), Nickle silicon alloy ($Ni_xSi_y$), tungsten silicon alloy ($W_xSi_y$), molybdenum silicon alloy ($Mo_xSi_y$), tantalum silicon alloy ($Ta_xSi_y$), or other conductive materials. The conductive material of the second layer may be the same or different from that of the first layer. In one embodiment, W is used. The conductive material is formed by CVD, PVD, ALD, electroplating or other suitable methods. In some embodiments, the W layer 92 is formed by two or more different forming conditions. For example, a nucleation layer is formed after the surface treatment using $H_2$ gas, another nucleation layer formed by using $SiH_4$ and/or a CVD is used to fill a space with W. Since the widths of the gates for short channel FETs (82, 84) are small, the second layer 92 fully fill the gate spaces 82 and 84, while the second layer 92 only partially fills the gate space 86 for the gate of the long channel FET, as shown in FIG. 8.

Figure 10:
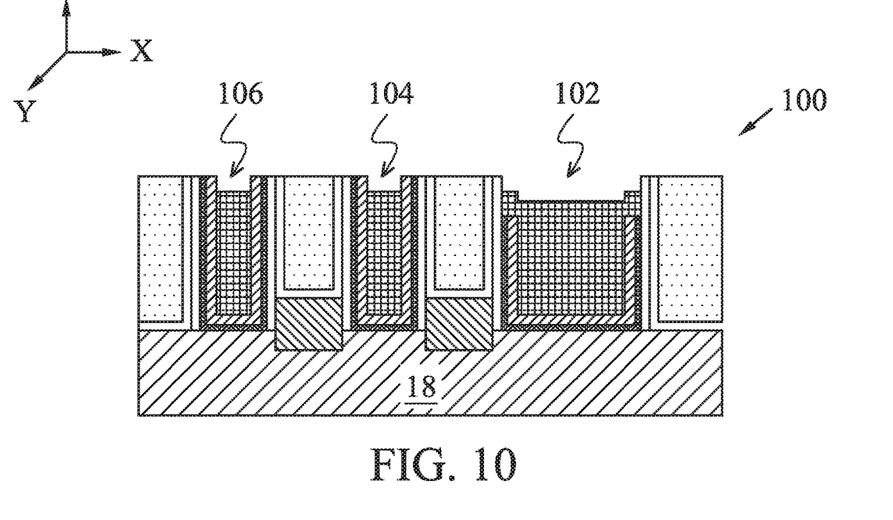
FIG. 10 depicts one stage in a method of manufacturing a semiconductor device with metal gate etch selectivity control according to one or more embodiments of the present disclosure.

In S15 of FIG. 1, a recess etch process is performed to remove portions of the second layer 92 of FIG. 9 to create recessed portions 102, 104, and 106 in filled gate spaces, as shown in an X-cut view 100 of FIG. 10. In some embodiments, the recess etch can be performed using a dry etch process, such as a plasma etch process, although other etch processes may be used in other embodiments. One of the advantageous features of the subject disclosure is metal gate etch selectivity control with reduction in loss of gate height of the short channel gates as compared to the long channel gate, which in traditional methods can be significant due to the short channel etch first process. This process is not used in the subject disclosure, as a conductive (tungsten) hard mask (e.g., 72 of FIG. 7) is used instead of the silicon nitride (SiN) hard mask used for the long channel in conventional methods, as explained later with respect to FIG. 12.

Figure 11:
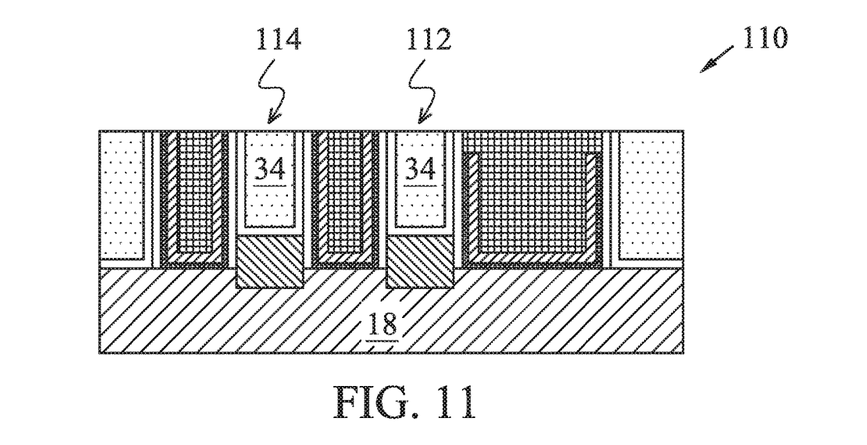
FIG. 11 depicts one stage in a method of manufacturing a semiconductor device with metal gate etch selectivity control according to one or more embodiments of the present disclosure.

In S16 of FIG. 1, a planarization process is performed, the result of which is shown in an X-cut view 110 of FIG. 11. The planarization process can include a chemical mechanical polishing (CMP) and/or an etch-back process.

Figure 12:
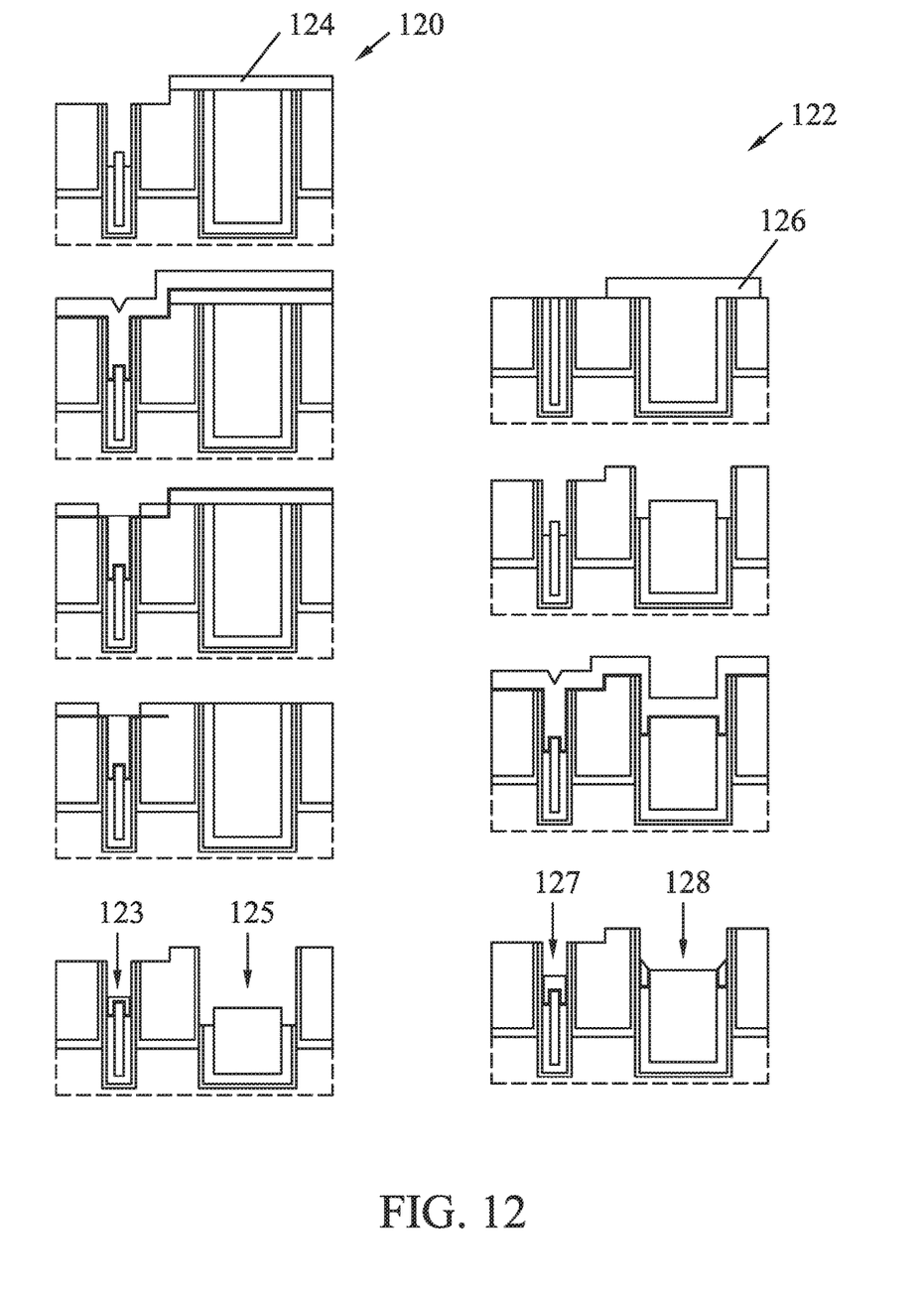
FIG. 12 shows process flow diagrams depicting a comparison between a gate-height loss in the manufacturing method of the subject technology and a comparative manufacturing method.

FIG. 12 shows process flow diagrams 120 and 122 depicting a comparison between a gate-height loss in the manufacturing method of the subject technology and a comparative manufacturing method. The process flow diagram 120 shows a number of stages of a comparative flow for a multi-patterning gate (MPG) loop. As shown in the comparative process flow diagram 120, the material for the hard mask of the long channel is SiN. One of the disadvantages of the comparative process flow is a substantial gate-height loss caused by reduced ILD height that can result from the hard mask removal process. The gate-height loss in the comparative process flow diagram 120 is shown as 123 and 125 for the short channel and long channel gates. The process flow diagram 122 shows a number of stages of the process flow for the disclosed MPG loop that was discussed in details above. As explained above with regard to FIGS. 9 and 10, the hard mask layer 92 used in the subject disclosure is of the same conductive material (e.g., tungsten) that is used for gate metals (e.g., 62 of FIG. 8). Therefore, the etch stage used in comparative methods to remove the silicon nitride (SiN) hard mask of the long channel is not used in the disclosed process flow. As a result, the gate-height loss in the disclosed process flow diagram 122, shown as 127 and 128 for the short channel and long channel gates, are significantly smaller. For example, for a gate height of about 70 nm the gate-height loss in the comparative process flow can be as large as about 10 nm, whereas for the same gate height (70 nm), the gate-height loss of the disclosed process flow is less than about 3 nm, which is significantly smaller (than 10 nm). Accordingly, using the same conductive material as the gate metal for the long channel hard mask, as discussed above, drastically reduces the gate-height loss and thus improves device performance. In some embodiments, for a long channel transistor having an ~20 nm gate length, a gate height loading is less than ~0 nm, and for a long channel transistor having an ~18 nm gate length, the gate height loading is less than ~7 nm.

Figure 13:
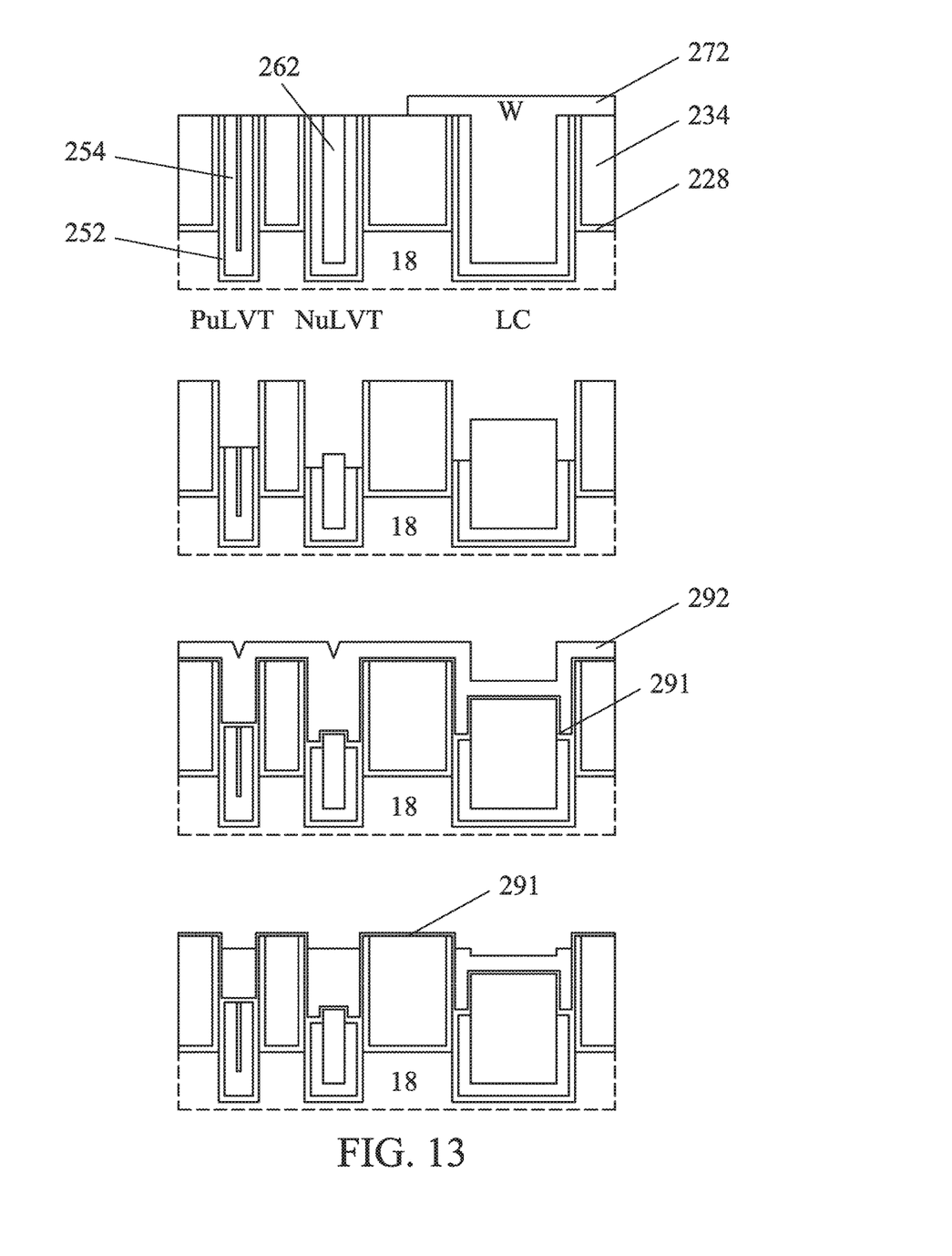
FIG. 13 shows process flow diagrams depicting a method of manufacturing a semiconductor device with metal gate etch selectivity control according to one or more embodiments of the present disclosure.

FIG. 13 shows process flow diagrams depicting a method of manufacturing a semiconductor device with metal gate etch selectivity control according to one or more embodiments of the present disclosure. Materials, configurations, layouts, dimensions, processes and/or operations same as or similar to those described with respect to FIGS. 1-12 may be employed in the following embodiments and the detailed explanation may be omitted.

As shown in FIG. 13, a P-type ultra-low voltage transistor (PuLVT), an N-type uLVT (NuLVT), each of which has the short channel gate, and a long channel transistor LC are illustrated. In the gate spaces for the PuLVT, NuLVT and the LC, a gate dielectric layer 252 and one or more work function adjustment (WFA) layers 254 are formed. Then, a first layer 262 of a conductive material is formed similar to FIG. 6, and the top layer of the first layer 262 is patterned and removed, thereby leaving a portion 272 that is to be used as a hard mask layer over the long channel gate LC. Then, a recess etching operation is performed for the PuLVT, nuLVT and the LC, similar to FIGS. 8 and 12. Next, a second layer 292 of the conductive material is formed similar to FIG. 9. In some embodiments, an adhesive layer 291, such as Ti, TiN, Ta and/or TaN, is formed before the second layer 292 is formed. Then, a recess etch process is performed to remove upper portions of the second layer 92 to create recessed portions in filled gate spaces, similar to FIG. 10. Then, the planarization operation similar to FIG. 11 is performed.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a first layer of a conductive material is formed in gate spaces created by removing portions of a dummy gate structure formed on a fin structure. The first layer further includes a top layer created on an entire structure formed on the fin structure, and the gate spaces include a gate space for a short channel gate and a gate space for a long channel gate. A first portion of the top layer is removed, thereby leaving a hard mask layer over a long channel gate region. The hard mask layer extends in a first direction on sides of the long channel gate. A first etching operation is performed to remove the hard mask layer and a top portion of the conductive material in the gate space for the short channel gate to form a first structure. A second layer of the conductive material is formed over the first structure. A second etching operation is performed to remove portions of the second layer to create a recessed conductive portion for the short channel gate and a recessed conductive portion for the long channel gate. A planarization process is performed, thereby forming the short channel gate and the long channel gate. In an embodiment, the fin structure extends in the first direction, wherein the entire structure formed on the fin structure includes a first insulating layer, and wherein the method further comprises forming source and drain structures after forming and patterning a protection layer. In an embodiment, the conductive material comprises an element including one of tungsten (W), cobalt (Co), ruthenium (Ru), or iridium (Ir). In an embodiment, the conductive material comprises a silicon alloy including one of titanium silicon alloy ($Ti_xSi_y$), cobalt silicon alloy ($Co_xSi_y$), Nickle silicon alloy ($Ni_xSi_y$), tungsten silicon alloy ($W_xSi_y$), molybdenum silicon alloy ($Mo_xSi_y$), tantalum silicon alloy ($Ta_xSi_y$). In an embodiment, the semiconductor device comprises short channel transistors including P-type ultra-low voltage transistors (PuLVT) and N-type uLVTs (NuLVTs), each of which has the short channel gate. In an embodiment, forming the gate structure includes forming a gate dielectric layer and a work-function adjustment layer prior to forming the first layer of the conductive material. In an embodiment, forming the first layer of the conductive material includes using plasma enhanced chemical vapor deposition (PECVD) or a physical vapor deposition (PVD) process. In an embodiment, performing the first etching operation includes performing a dry etch including a plasma etch process. In an embodiment, performing the second etching operation includes performing a dry etch including a plasma etch process.

In accordance with another aspect of the present disclosure, in a method of manufacturing a semiconductor device, a first conductive layer is formed in a plurality of gate spaces formed on a fin structure the first conductive layer including an overall top layer. A first portion of the overall top layer is removed, thereby leaving a hard mask layer over a long channel gate region. The hard mask layer extends in a first direction on sides of the long channel gate. A first etching operation is performed to remove the hard mask layer and a top portion the first conductive layer in the plurality of gate spaces to form a first structure. A second conductive layer is formed over the first structure. Portions of the second conductive layer are removed to create recessed portions in filled gate spaces. Source and drain structures are formed. In an embodiment, prior to forming the first conductive layer in the plurality of gate spaces, a dummy gate structure is formed over the fin structure extending in the first direction. The dummy gate structure includes one or more dummy short channel gates and a dummy long channel gate. In an embodiment, a first insulating layer is formed over the dummy gate structure, and a second etching operation is performed to remove portions of the dummy gate structure thereby forming the gate spaces having bottom surfaces of the gate spaces on the fin structure. In an embodiment, short channel gates are associated with short channel transistors including P-type ultra-low voltage transistors (PuLVT) and N-type uLVTs (NuLVTs). In an embodiment, the first and second conductive layers comprise an element including one of tungsten (W), cobalt (Co), ruthenium (Ru), or iridium (Ir). In an embodiment, first and second conductive layers comprise a silicon alloy including one of titanium silicon alloy ($Ti_xSi_y$), cobalt silicon alloy ($Co_xSi_y$), Nickle silicon alloy ($Ni_xSi_y$), tungsten silicon alloy ($W_xSi_y$), molybdenum silicon alloy ($Mo_xSi_y$), tantalum silicon alloy ($Ta_xSi_y$). In an embodiment, the first conductive layer is formed using a plasma enhanced chemical vapor deposition (PECVD) or a physical vapor deposition (PVD) process. In an embodiment, the first etching operation comprises a dry etch process including a plasma etch process, and wherein removing portions of the second conductive layer comprises a recess etch process including a plasma etch process. In an embodiment, a protection layer is formed and patterned prior to forming source and drain structures.

In accordance with another aspect of the present disclosure, in a method of manufacturing a semiconductor device, a first layer of a conductive material is formed on a first structure to fill gate spaces for a short channel gate and a long channel gate and create a top layer over an entire structure formed on the fin structure. A first portion of the top layer is removed, thereby leaving a second portion of the top layer over a long channel gate region to act as a hard mask layer. The hard mask layer and a top portion the conductive material filling the gate space for the short channel gate are removed to form a second structure. A second layer of the conductive material is formed over the second structure. An etching operation is performed to remove portions of the second layer to create a recessed conductive portion for the short channel gate and a recessed conductive portion for the long channel gate. A height of the recessed conductive portion for the long channel gate is smaller than a height of the recessed conductive portion for the short channel gate. In an embodiment, for a long channel transistor having an approximately 20 nm gate length, a gate height loading is less than about 0 nm, and wherein for a long channel transistor having an approximately 18 nm gate length, the gate height loading is less than about 7 nm.

The foregoing outline features several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first layer of a conductive material to fill gate spaces created by removing portions of a dummy gate structure formed on a fin structure, the first layer further including a top layer created over an entire structure, including the filled gate spaces, formed on the fin structure, and the gate spaces including a gate space for a short channel gate and a gate space for a long channel gate;
    removing a first portion of the top layer, thereby leaving a hard mask layer over a long channel gate region, the hard mask layer extending in a first direction on sides of the long channel gate;
    performing a first etching operation to remove the hard mask layer and a top portion of the conductive material in the gate space for the short channel gate to form a first structure;
    forming a second layer of the conductive material over the first structure;
    performing a second etching operation to remove portions of the second layer to create a recessed conductive portion for the short channel gate and a recessed conductive portion for the long channel gate; and
    performing a planarization process, thereby forming the short channel gate and the long channel gate.

2. The method of claim 1, wherein the fin structure extends in the first direction, wherein the entire structure formed on the fin structure includes a first insulating layer, and wherein the method further comprises forming source and drain structures after forming and patterning a protection layer.

3. The method of claim 1, wherein the conductive material comprises an element including one of tungsten (W), cobalt (Co), ruthenium (Ru), or iridium (Ir).

4. The method of claim 1, wherein the conductive material comprises a silicon alloy including one of titanium silicon alloy ($Ti_xSi_y$), cobalt silicon alloy ($Co_xSi_y$), Nickle silicon alloy ($Ni_xSi_y$), tungsten silicon alloy ($W_xSi_y$), molybdenum silicon alloy ($Mo_xSi_y$), tantalum silicon alloy ($Ta_xSi_y$).

5. The method of claim 1, wherein the semiconductor device comprises short channel transistors including P-type ultra-low voltage transistors (PuLVT) and N-type uLVTs (NuLVTs), each of which has the short channel gate.

6. The method of claim 1, wherein forming the dummy gate structure comprises forming a gate dielectric layer and a work-function adjustment layer prior to forming the first layer of the conductive material.

7. The method of claim 1, wherein forming the first layer of the conductive material comprises using plasma enhanced chemical vapor deposition (PECVD) or a physical vapor deposition (PVD) process.

8. The method of claim 1, wherein performing the first etching operation comprises performing a dry etch including a plasma etch process.

9. The method of claim 1, wherein performing the second etching operation comprises performing a dry etch including a plasma etch process.

10. A method of manufacturing a semiconductor device, the method comprising:
    forming a first conductive layer to fill a plurality of gate spaces formed on a fin structure, the first conductive layer including an overall top layer covering an entire structure, including the filled plurality of gate spaces, on the fin structure;
    removing a first portion of the overall top layer, thereby leaving a hard mask layer over a long channel gate region, the hard mask layer extending in a first direction on sides of the long channel gate region;
    performing a first etching operation to remove the hard mask layer and a top portion the first conductive layer in the plurality of gate spaces to form a first structure;
    forming a second conductive layer over the first structure;
    removing portions of the second conductive layer to create recessed portions in filled gate spaces; and
    forming source and drain structures.

11. The method of claim 10, further comprising, prior to forming the first conductive layer in the plurality of gate spaces, forming a dummy gate structure over the fin structure extending in the first direction, the dummy gate structure including one or more dummy short channel gates and a dummy long channel gate.

12. The method of claim 11, further comprising:
    forming a first insulating layer over the dummy gate structure; and
    performing a second etching operation to remove portions of the dummy gate structure thereby forming the gate spaces having bottom surfaces of the gate spaces on the fin structure.

13. The method of claim 11, wherein short channel gates are associated with short channel transistors including P-type ultra-low voltage transistors (PuLVT) and N-type uLVTs (NuLVTs).

14. The method of claim 10, wherein the first and second conductive layers comprise an element including one of tungsten (W), cobalt (Co), ruthenium (Ru), or iridium (Ir).

15. The method of claim 10, wherein first and second conductive layers comprise a silicon alloy including one of titanium silicon alloy ($Ti_xSi_y$), cobalt silicon alloy ($Co_xSi_y$), Nickle silicon alloy ($Ni_xSi_y$), tungsten silicon alloy ($W_xSi_y$), molybdenum silicon alloy ($Mo_xSi_y$), tantalum silicon alloy ($Ta_xSi_y$).

16. The method of claim 10, wherein the first conductive layer is formed using a plasma enhanced chemical vapor deposition (PECVD) or a physical vapor deposition (PVD) process.

17. The method of claim 10, wherein the first etching operation comprises a dry etch process including a plasma etch process, and wherein removing portions of the second conductive layer comprises a recess etch process including a plasma etch process.

18. The method of claim 10, further comprising forming and patterning a protection layer prior to forming source and drain structures.

19. A method of manufacturing a semiconductor device, the method comprising:

forming a first layer of a conductive material on a first structure to fill gate spaces for a short channel gate and a long channel gate, the first layer includes a top layer covering an entire structure, including the filled gate spaces, on a fin structure;

removing a first portion of the top layer, thereby leaving a second portion of the top layer over a long channel gate region to act as a hard mask layer;

removing the hard mask layer and a top portion of the conductive material filling the gate space for the short channel gate to form a second structure;

forming a second layer of the conductive material over the second structure; and performing an etching operation to remove portions of the second layer to create a recessed conductive portion for the short channel gate and a recessed conductive portion for the long channel gate, wherein a height of the recessed conductive portion for the long channel gate is smaller than a height of the recessed conductive portion for the short channel gate.

20. The method of claim 19, wherein for a long channel transistor having an approximately 20 nm gate length, a gate height loading is less than about 0 nm, and wherein for a long channel transistor having an approximately 18 nm gate length, the gate height loading is less than about 7 nm.

\* \* \* \* \*